United States Patent
Hwang (10) Patent No.: US 8,324,070 B2
(45) Date of Patent: Dec. 4, 2012

(54) SEMICONDUCTOR DEVICE AND METHOD FOR MANUFACTURING THE SAME

(75) Inventor: Yun Taek Hwang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 593 days.

(21) Appl. No.: 12/133,557

(22) Filed: Jun. 5, 2008

(65) Prior Publication Data

US 2009/0218628 A1    Sep. 3, 2009

(30) Foreign Application Priority Data

Feb. 29, 2008   (KR) .................. 10-2008-0018876

(51) Int. Cl.
*H01L 21/76* (2006.01)

(52) U.S. Cl. .......... 438/405; 438/151; 438/153; 257/69; 257/369; 257/E21.614; 257/E27.026

(58) Field of Classification Search .................. 257/66, 257/67, 69, 347, 353, 369, E21.614, E27.026; 438/151, 152, 153, 405
See application file for complete search history.

(56) References Cited

U.S. PATENT DOCUMENTS

| | | | | |
|---|---|---|---|---|
| 6,882,010 B2 * | 4/2005 | Bhattacharyya | ............... | 257/350 |
| 7,537,980 B2 * | 5/2009 | Son et al. | ....................... | 438/151 |
| 7,608,489 B2 * | 10/2009 | Chidambarrao et al. | ..... | 438/142 |
| 7,741,644 B2 * | 6/2010 | Lyu et al. | ......................... | 257/67 |
| 7,754,513 B2 * | 7/2010 | Mandelman et al. | ........... | 438/44 |
| 2006/0105528 A1 | 5/2006 | Cho et al. | | |
| 2008/0254594 A1 * | 10/2008 | Chan et al. | .................... | 438/455 |
| 2009/0218604 A1 * | 9/2009 | Hwang | ........................ | 257/288 |
| 2009/0218635 A1 * | 9/2009 | Hwang | ........................ | 257/382 |

FOREIGN PATENT DOCUMENTS

| | | |
|---|---|---|
| JP | 2002-198528 A | 7/2002 |
| KR | 10-2003-0086804 | 11/2003 |
| KR | 10-2005-0092803 | 9/2005 |

* cited by examiner

*Primary Examiner* — Eduardo A Rodela (74) *Attorney, Agent, or Firm* — Marshall, Gerstein & Borun LLP (57) ABSTRACT

A semiconductor device includes a NMOS transistor of a peripheral circuit region. The NMOS transistor is formed over a relaxed silicon germanium layer and a silicon layer to have a tensile strain structure, thereby increasing electron mobility of a channel region in operation of the device. The semiconductor device may include a second active region including a first silicon layer connected to a first active region of a semiconductor substrate, a second silicon layer and a relaxed silicon germanium layer formed over the first silicon layer expected to be a NMOS region, and a NMOS gate formed over the second silicon layer.

14 Claims, 16 Drawing Sheets

SEMICONDUCTOR DEVICE AND METHOD FOR MANUFACTURING THE SAME

CROSS-REFERENCE TO RELATED APPLICATION

The present application claims priority to Korean patent application number 10-2008-0018876, filed on Feb. 29, 2008 which is incorporated by reference in its entirety.

BACKGROUND OF THE INVENTION

The present invention relates to a semiconductor device and a method for manufacturing a semiconductor device, and more specifically, to a technology of forming transistors having a stacked structure in a peripheral circuit region and forming a NMOS transistor of an upper layer over a silicon germanium layer and a silicon layer to have a tensile strain structure, thereby increasing electron mobility of a channel region in operation of the device.

Due to high integration of semiconductor devices, an area occupied by a device has been reduced. As a result, a transistor size becomes smaller, a space between a source region and a drain region becomes narrower, and a channel length becomes shorter. Also, a size of a contact plug that contacts with the source/drain region of the transistor is reduced.

When the size of the contact plug is reduced, a contact resistance (Rc) between a silicon substrate and the contact plug is increased. As a result, a current characteristic of the device is degraded obstructing high speed operation of the device.

SUMMARY OF THE INVENTION

Various embodiments of the present invention are directed at providing a method for manufacturing a semiconductor device that may include forming a NMOS transistor of a peripheral circuit region over a relaxed silicon germanium layer and a silicon layer to have a tensile strain structure, thereby increasing electron mobility of a channel region in operation of the device.

Various embodiments of the present invention are directed at providing a semiconductor device that may include a transistor having a stacked structure in a peripheral circuit region to increase net die.

According to an embodiment of the present invention, a semiconductor device comprises: a first active region formed in a semiconductor substrate; a second active region located over the first active region, wherein the second active region is connected to the first active region; a foundation layer formed according to a type of a transistor in the second active region; and a gate formed on the foundation layer, wherein the foundation layer includes a relaxed silicon germanium layer and a silicon layer in a NMOS region of the second active region. The second active region may include a silicon layer. The semiconductor device further may include an intervening layer between the first active region and the second active region.

The foundation layer may include another silicon layer in a PMOS region of the second active region. A mole ratio of germanium in the relaxed silicon germanium layer may be 0.1 to 0.5.

According to an embodiment of the present invention, a method for manufacturing a semiconductor device may include: forming a first active region in a semiconductor substrate; forming a second active region over the first active region, wherein the second active region is connected to the first active region; forming a foundation layer according to a type of a transistor in the second active region; and forming a gate on the silicon layer. The forming a foundation layer may include: forming a relaxed silicon germanium layer in a NMOS region of the second active region; and forming a silicon layer on the relaxed silicon germanium layer.

The forming a second active region may include: forming an insulating film on the first active region; forming a contact hole exposing the first active region by penetrating the insulating film; and growing another silicon layer in the contact hole and on the insulating film.

The silicon layer may be formed with a thickness in a range of 500 Å to 20000 Å from a top surface of the insulating film. The silicon layer may be formed by a selective epitaxial growth.

The forming a relaxed silicon germanium layer may include: forming a first hard mask pattern exposed the NMOS region on the second active region; forming a trench in the NMOS region by using the first hard mask pattern as an etch mask; growing a relaxed silicon germanium layer in the trench; and removing the first hard mask pattern and planarizing the relaxed silicon germanium layer.

The trench may have a depth ranging from 300 Å to 10000 Å. The relaxed silicon germanium layer may be formed by a selective epitaxial growth under a condition that a mole ratio of the germanium in the relaxed silicon germanium layer may be increased from a bottom to a top of the trench. The mole ratio of the germanium in the relaxed silicon germanium layer may be 0.1 to 0.5. The relaxed silicon germanium layer may have a thickness ranging from 300 Å to 10000 Å.

The forming a silicon layer may include: forming a second hard mask pattern exposed the relaxed silicon germanium layer on the second active region; growing a silicon layer using by the second hard mask pattern as a growth barrier; and planarizing the second silicon layer and removing the second hard mask pattern. The silicon layer may be formed by a selective epitaxial growth. The silicon layer may have a thickness ranging from 500 Å to 2000 Å.

After the forming a silicon layer, the method may include: forming a third hard mask pattern exposed a PMOS region on the second active region; growing another silicon layer using by the third hard mask pattern as a growth barrier on the first silicon layer; and exposing the second silicon layer planarizing the third hard mask pattern and the third silicon layer. The silicon layer may be formed by a selective epitaxial growth. The silicon layer has a thickness ranging from 300 Å to 2000 Å.

DETAILED DESCRIPTION OF THE SPECIFIC EMBODIMENT

Figure 1:
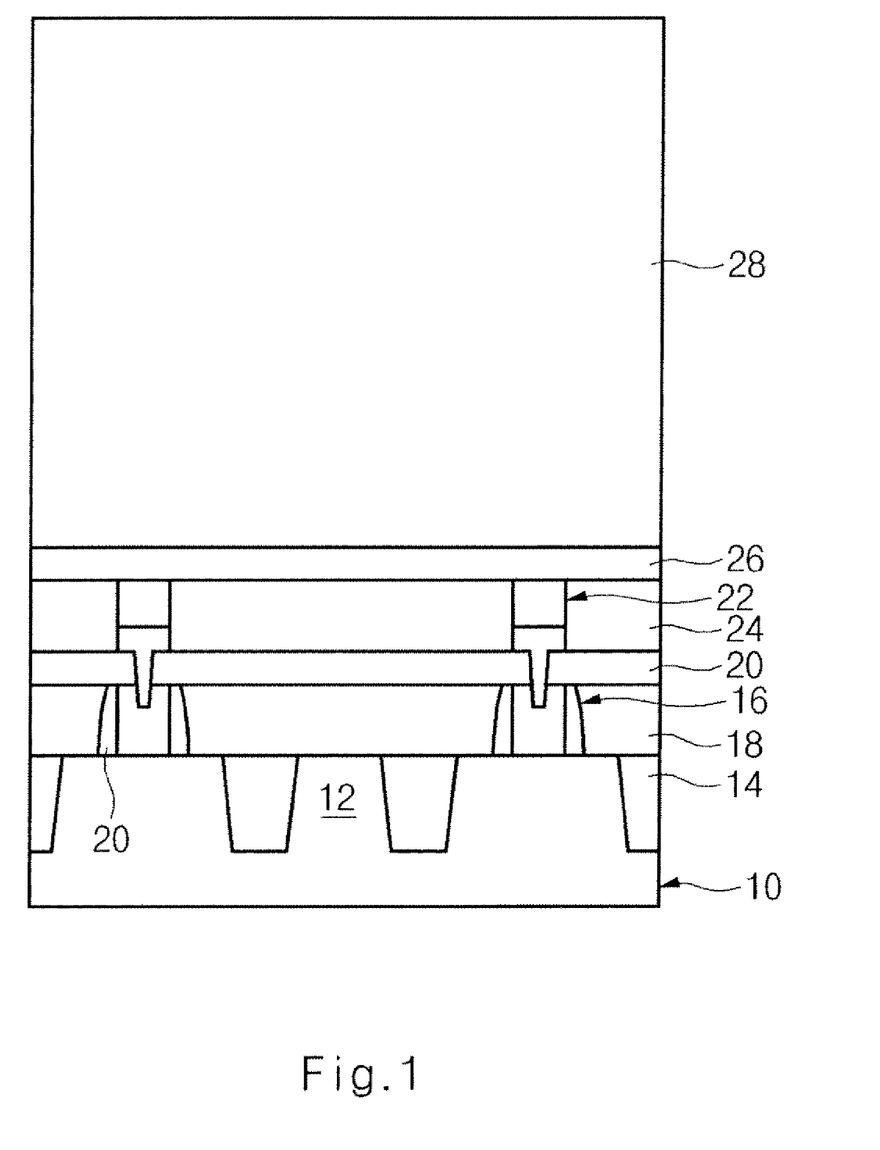
FIGS. 1 to 16 are cross-sectional diagrams illustrating a method for manufacturing a semiconductor device according to an embodiment of the present invention.

Referring to FIG. 1, a first device isolating film 14 that defines a first active region 12 is formed in a peripheral circuit region of a semiconductor substrate 10. The first device isolating film 14 is formed by a shallow trench isolation (STI) process.

A first gate 16 is formed over the first active region 12. A first interlayer insulating film 18 is formed over the semiconductor substrate 10 including the first gate 16 to fill a gap between the first gates 16.

A second interlayer insulating film 20 is formed over the first interlayer insulating film 18 including the first gate 16. The second interlayer insulating film 20 is selectively etched to form a bit line contact hole (not shown) that exposes the first gate 16.

A conductive layer (not shown) is formed over the second interlayer insulating film 20 including the bit line contact hole. The conductive layer is etched by a photo-etching process with a bit line mask (not shown) to form a bit line 22.

A third interlayer insulating film 24 is formed over the second interlayer insulating film 20 to fill a space between the bit line 22. An etching barrier film 26 is formed over the bit line 22 and the third interlayer insulating film 24.

A fourth interlayer insulating film 28 is formed over the etching barrier film 26. The fourth interlayer insulating film 28 is formed to have a thickness ranging from about 5000 Å to about 20000 Å.

Figure 2:
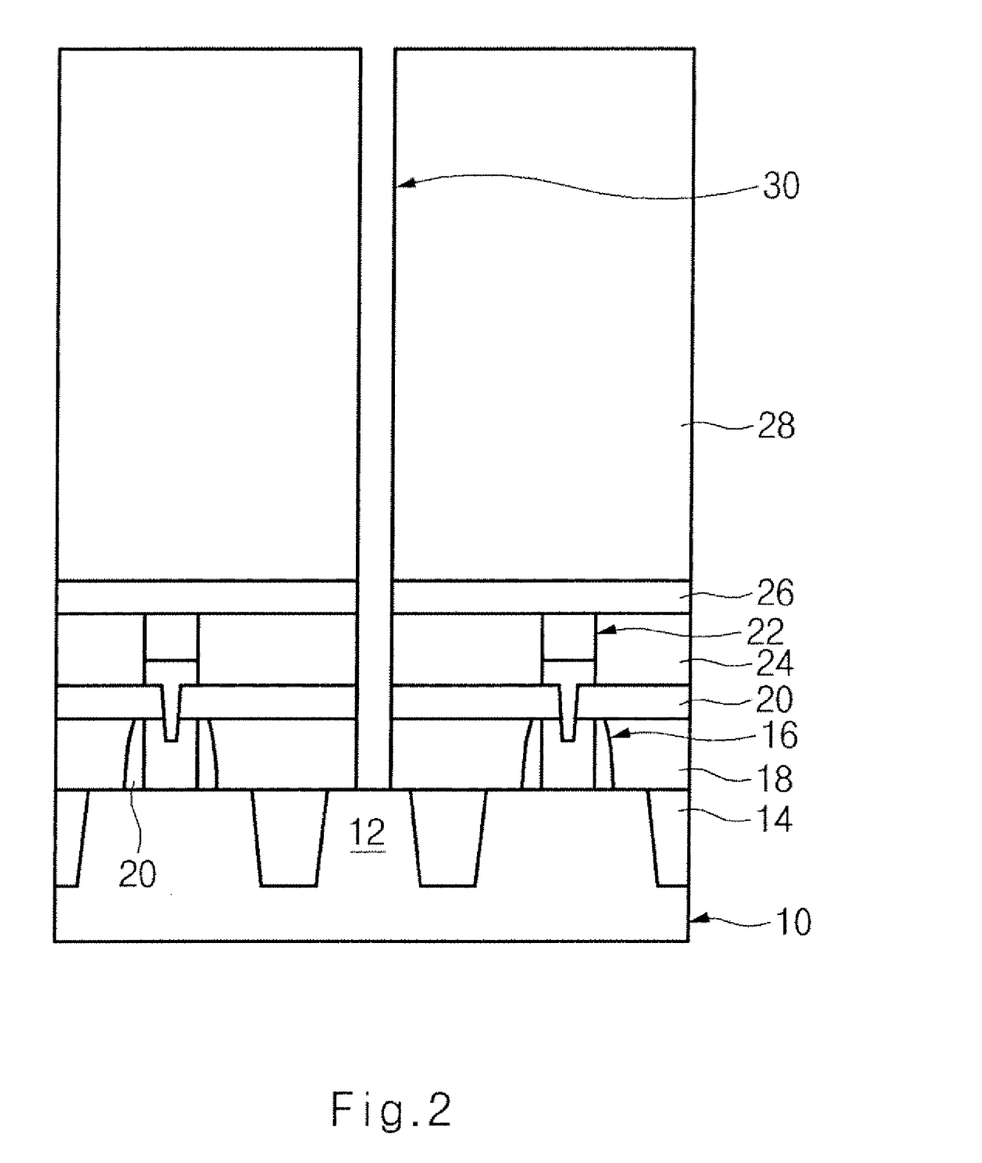

Referring to FIG. 2, the fourth interlayer insulating 28, the etching barrier film 26, the third interlayer insulating film 24, the second interlayer insulating film 20 and the first interlayer insulating film 18 which are formed between the first gates 16 are selectively etched to form a contact hole 30 that exposes the first active region 12.

Figure 3:
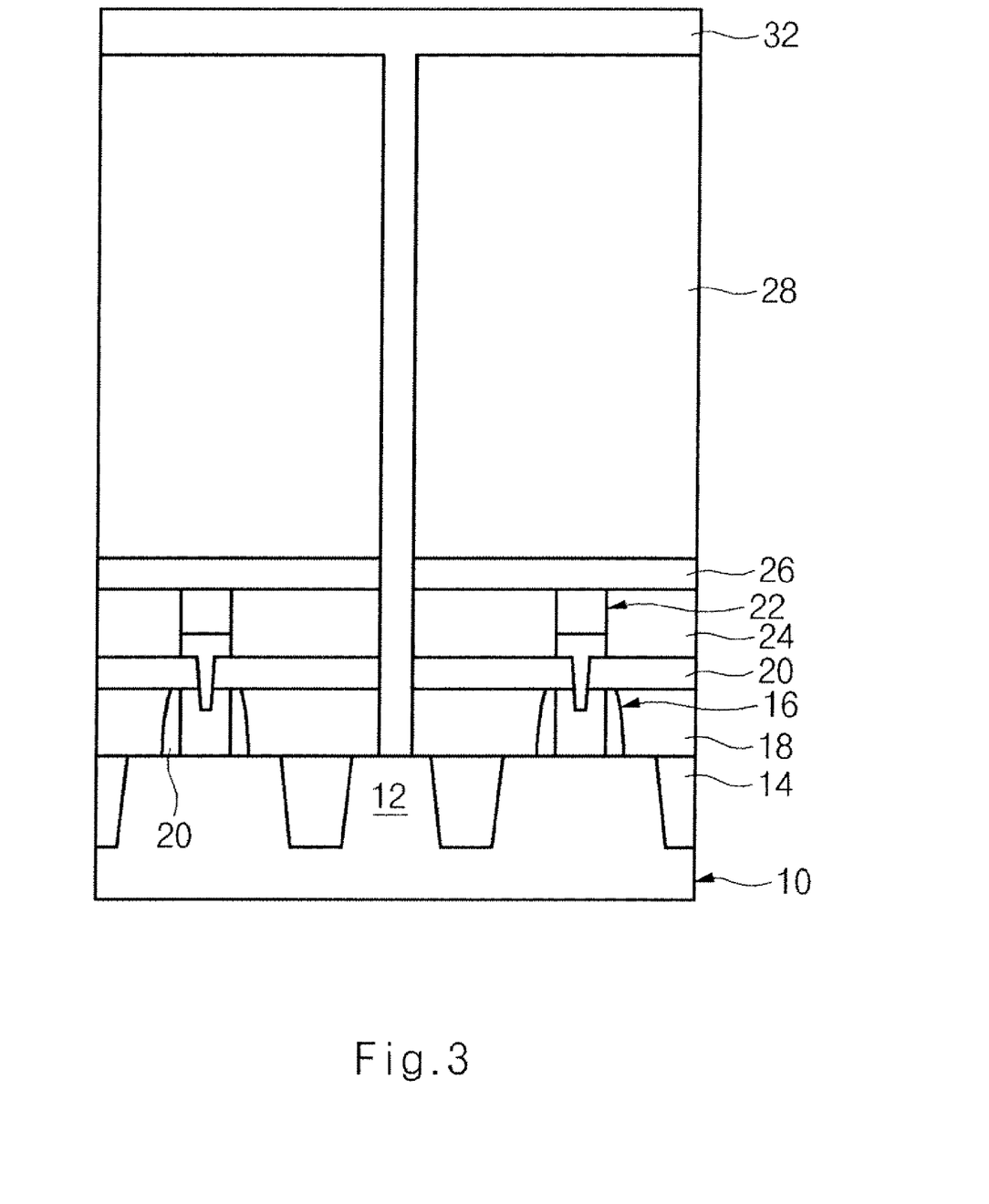

Referring to FIG. 3, a first silicon layer 32 is formed over the fourth interlayer insulating film 28 to fill the contact hole 30 by a selective epitaxial growth (SEG) process with the first active region 12 exposed by the contact hole 30 as a seed layer. Herein, the first silicon layer 32 can be formed by a two step process. The first silicon layer 32 is grown to fill a part of the contact hole 30, and re-grown to fill fully the contact hole 30. The first silicon layer 32 is planarized.

The first silicon layer 32 is formed over the fourth interlayer insulating film 28 to have a thickness ranging from about 500 Å to about 20000 Å. The first silicon layer 32 is planarized by a process selected from the group consisting of a chemical mechanical polishing (CMP) process, an etch-back process and combinations thereof.

Figure 4:
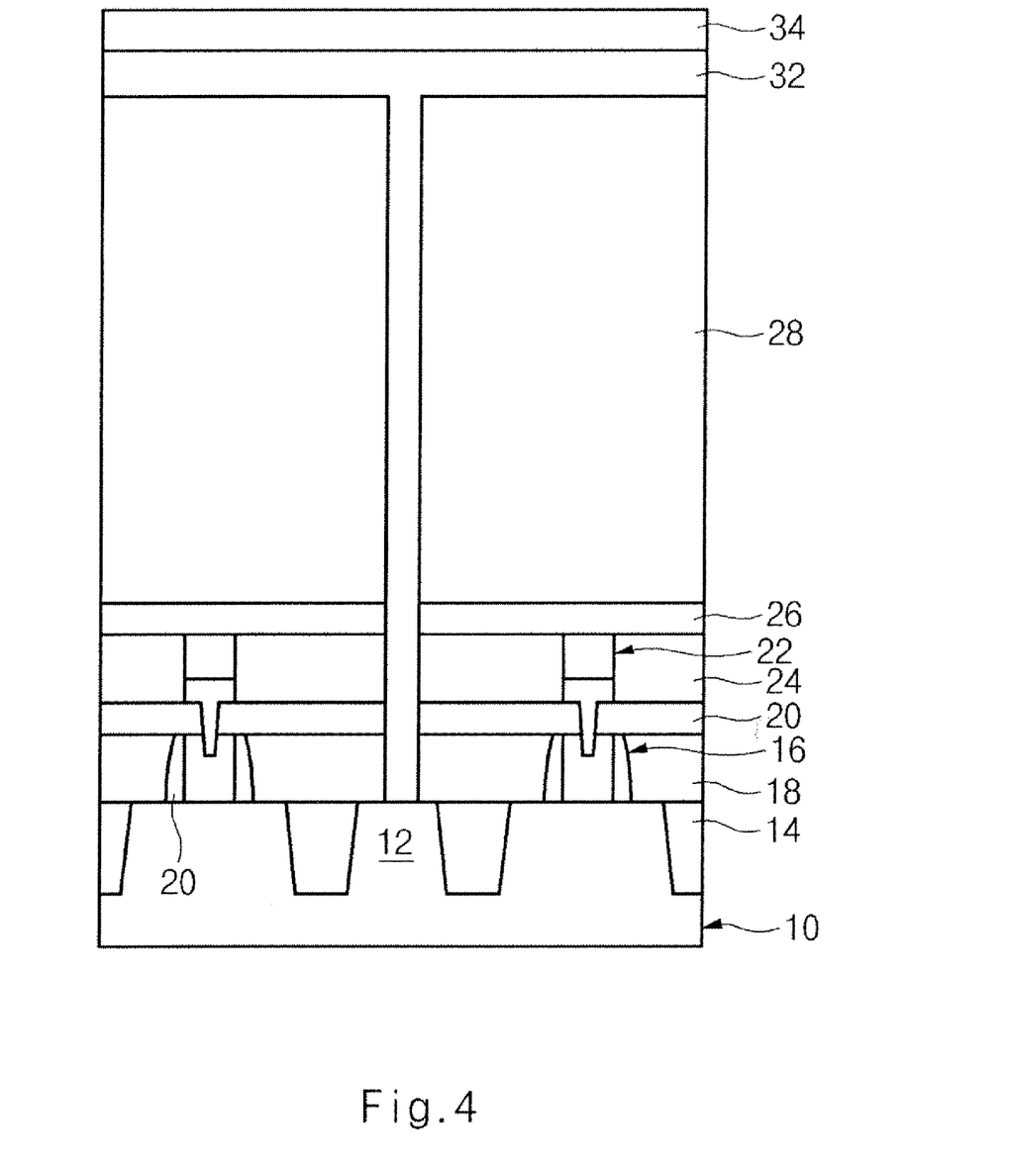

Referring to FIG. 4, a first hard layer 34 is formed over the first silicon layer 32. The first hard mask layer 34 includes an oxide film to have a thickness ranging from about 100 Å to about 3000 Å.

Figure 5:
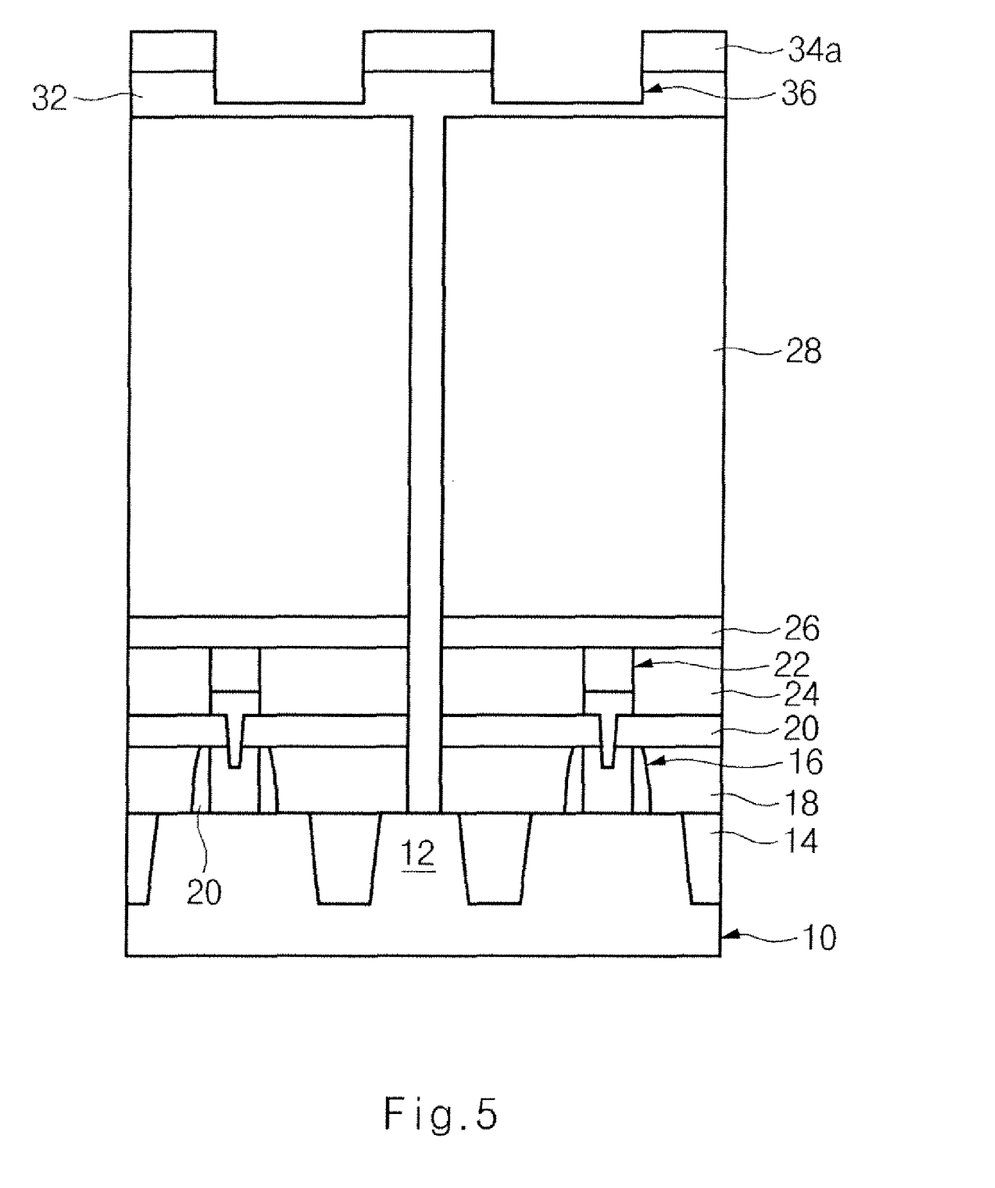

Referring to FIG. 5, the first hard mask layer 34 of a NMOS region is removed to form a first hard mask pattern 34a. The first hard mask layer 34 is removed by a plasma etching process.

The first silicon layer 32 is etched with the first hard mask pattern 34a as an etching mask to form a trench 36. The trench 36 is formed to have a depth ranging from about 300 Å to about 10000 Å.

Figure 6:
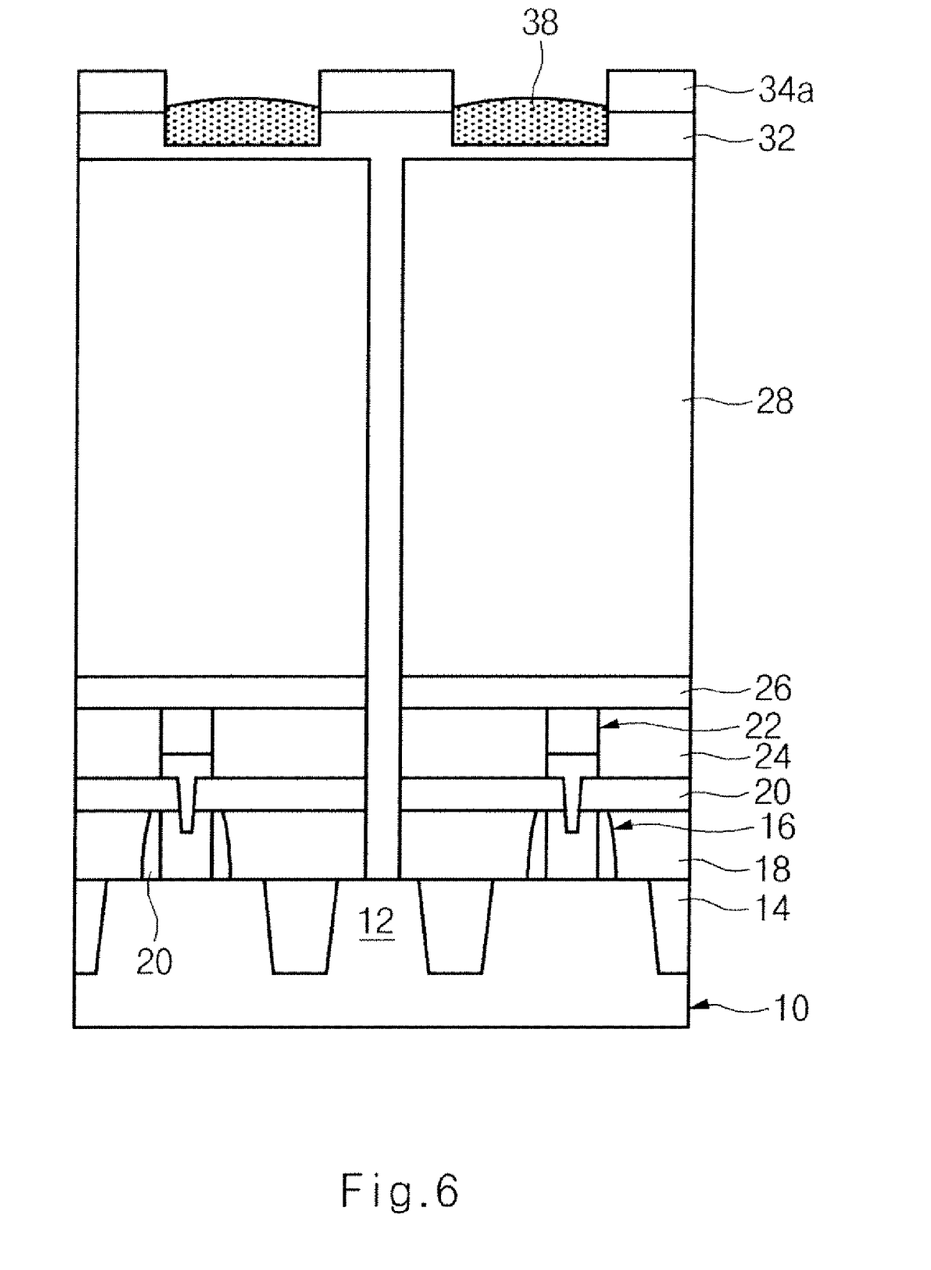

Referring to FIG. 6, a relaxed silicon germanium (Si1-xGex) layer 38 (x is an actual number, $0.1 \leq x \leq 0.5$) is formed in the trench 36 with the first silicon layer 32 exposed by the trench 36 as a seed layer. The relaxed Si1-xGex layer 38 minimizes dislocation generated from the Si1-xGex layer that affects the upper layer when the Si1-xGex layer 38 is grown in the first silicon layer 32. That is, when the Si1-xGex layer 38 is grown, the concentration of germanium (Ge) is gradually changed so that the change in the Si1-xGex layer 38 is relaxed not to transmit the change to the surface. The concentration of germanium (Ge) may be increased as the trench 36 goes higher from the bottom to the top. A mole ratio of germanium in the relaxed silicon germanium layer may be 0.1 to 0.5. The relaxed Si1-xGex layer 38 is formed by a SEG process to have a thickness ranging from about 300 Å to about 10000 Å.

Figure 7:
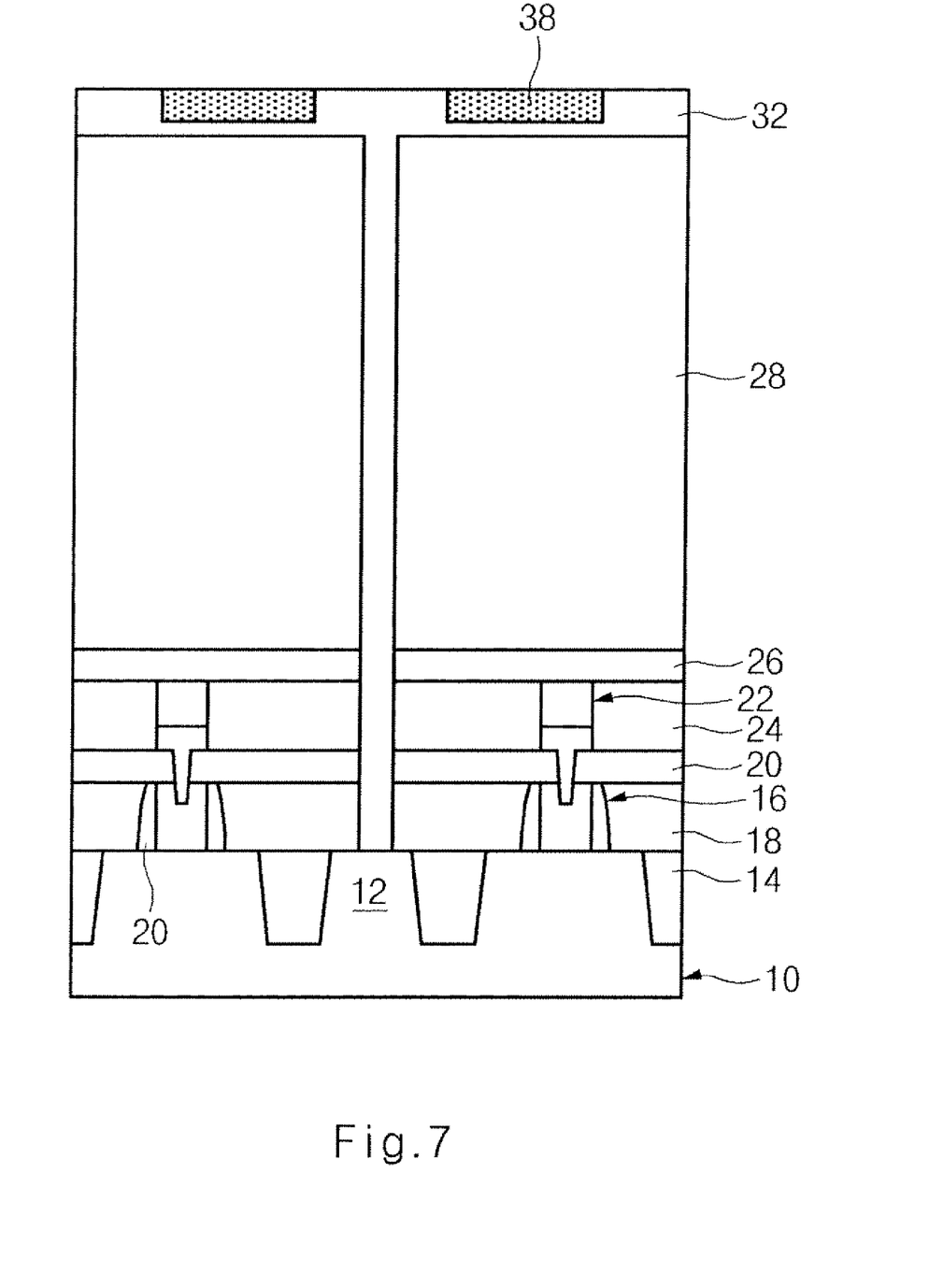

Referring to FIG. 7, the first hard mask pattern 34a is removed. The relaxed Si1-xGex layer 38 and the first silicon layer 32 are planarized. The relaxed Si1-xGex layer 38 and the first silicon layer 32 are planarized by a process selected from the group consisting of a chemical mechanical polishing (CMP) process, an etch-back process and combinations thereof.

Figure 8:
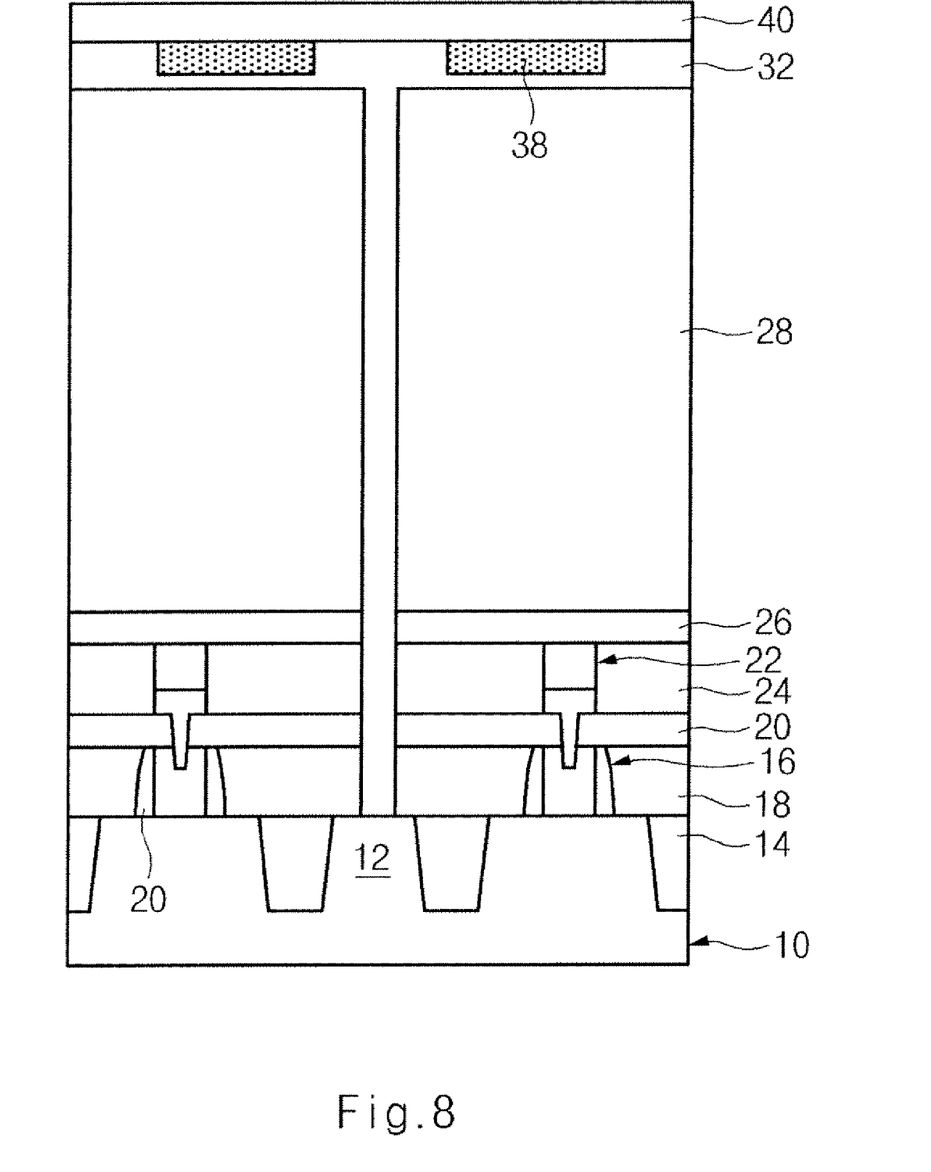

Referring to FIG. 8, a second hard mask layer 40 is formed over the relaxed Si1-xGex layer 38 and the first silicon layer 32. The second hard mask layer 40 includes an oxide film to have a thickness ranging from about 100 Å to about 3000 Å.

Figure 9:
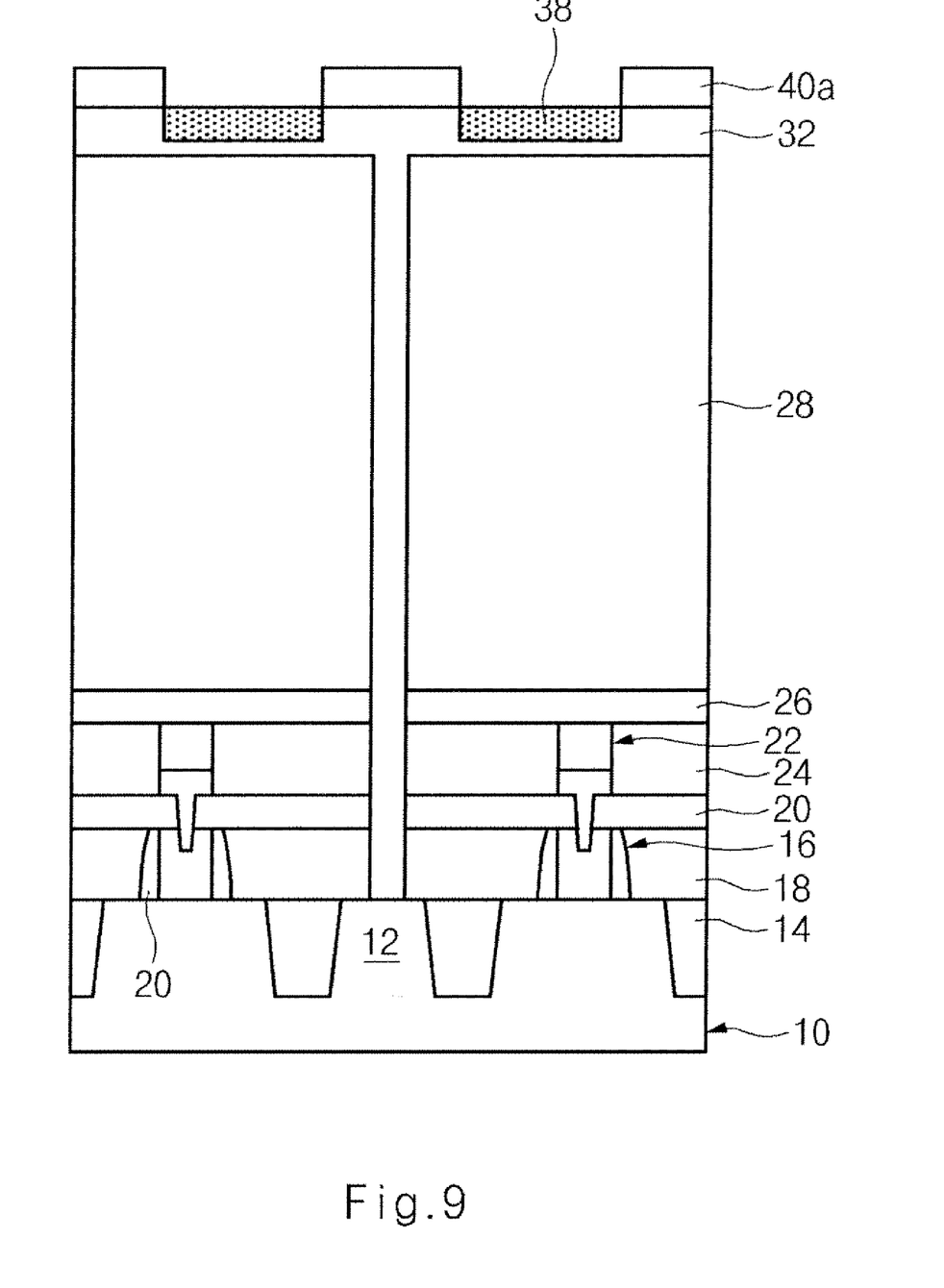

Referring to FIG. 9, the second hard mask layer 40 of a NMOS region is removed to form a second hard mask pattern 40a that exposes the relaxed Si1-xGex layer 38. The second hard mask layer 40 is removed by a plasma etching process.

Figure 10:
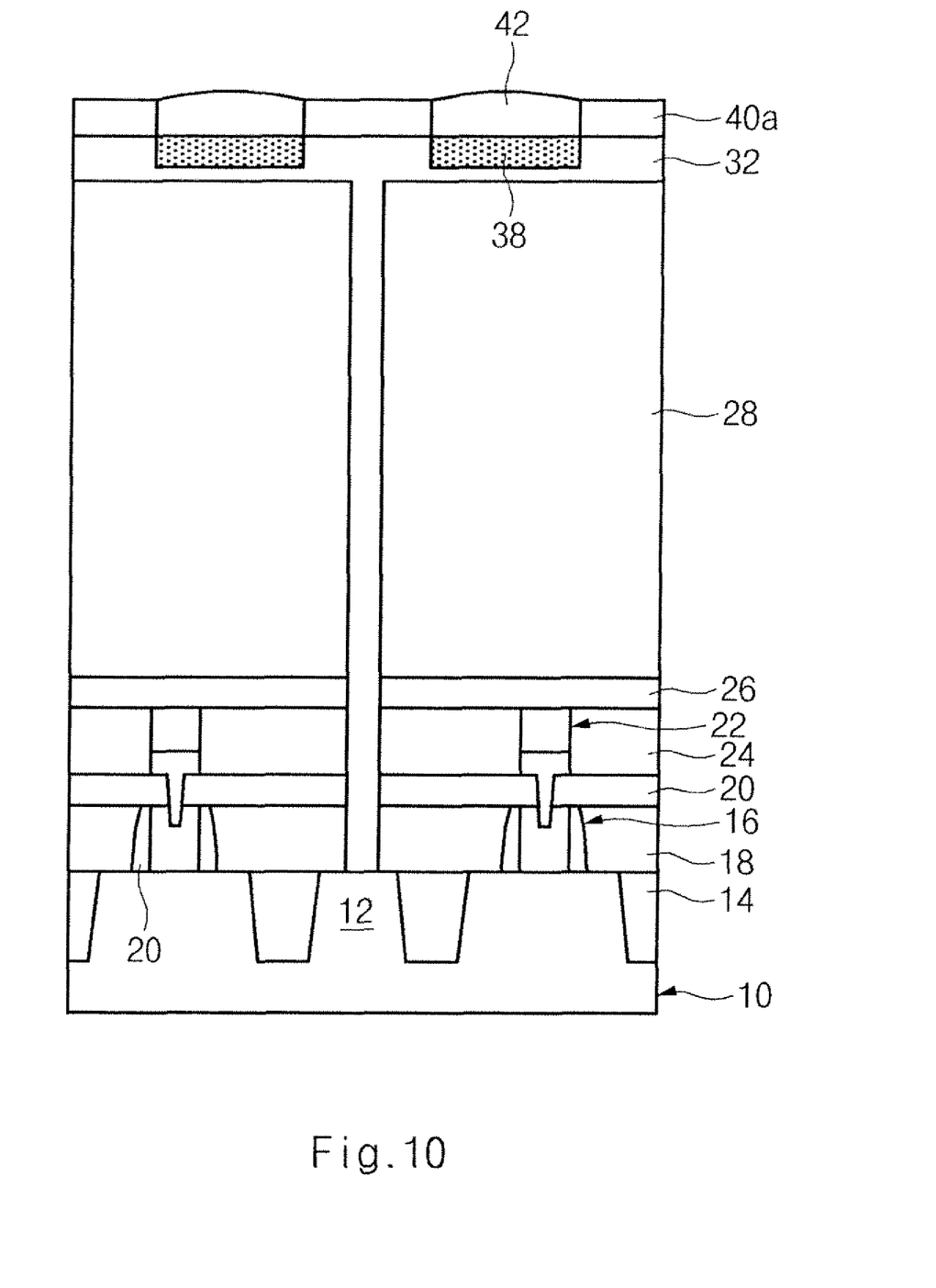

Referring to FIG. 10, a second silicon layer 42 is formed over the relaxed Si1-xGex layer 38 with the relaxed Si1-xGex layer 38 exposed by the second hard mask pattern 40a as a seed layer. The second silicon layer 42 is formed by a SEG process to have a thickness ranging from about 500 Å to about 2000 Å.

Figure 11:
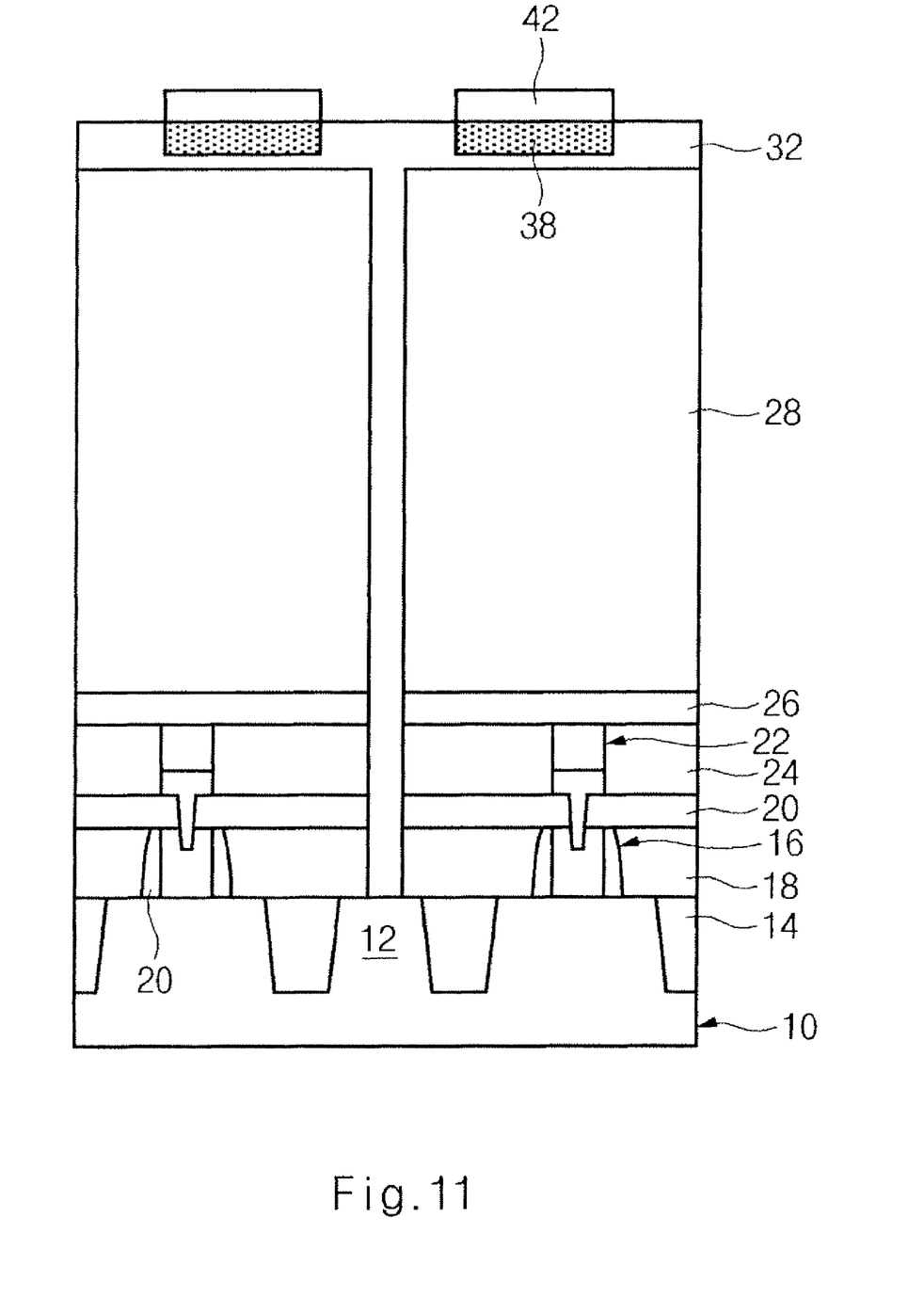

Referring to FIG. 11, the second silicon layer 42 and the second hard mask pattern 40a are planarized. The second hard mask pattern 40a is removed. The second silicon layer 46 and the second hard mask pattern 40a are planarized by a process selected from the group consisting of a chemical mechanical polishing (CMP) process, an etch-back process and combinations thereof.

Figure 12:
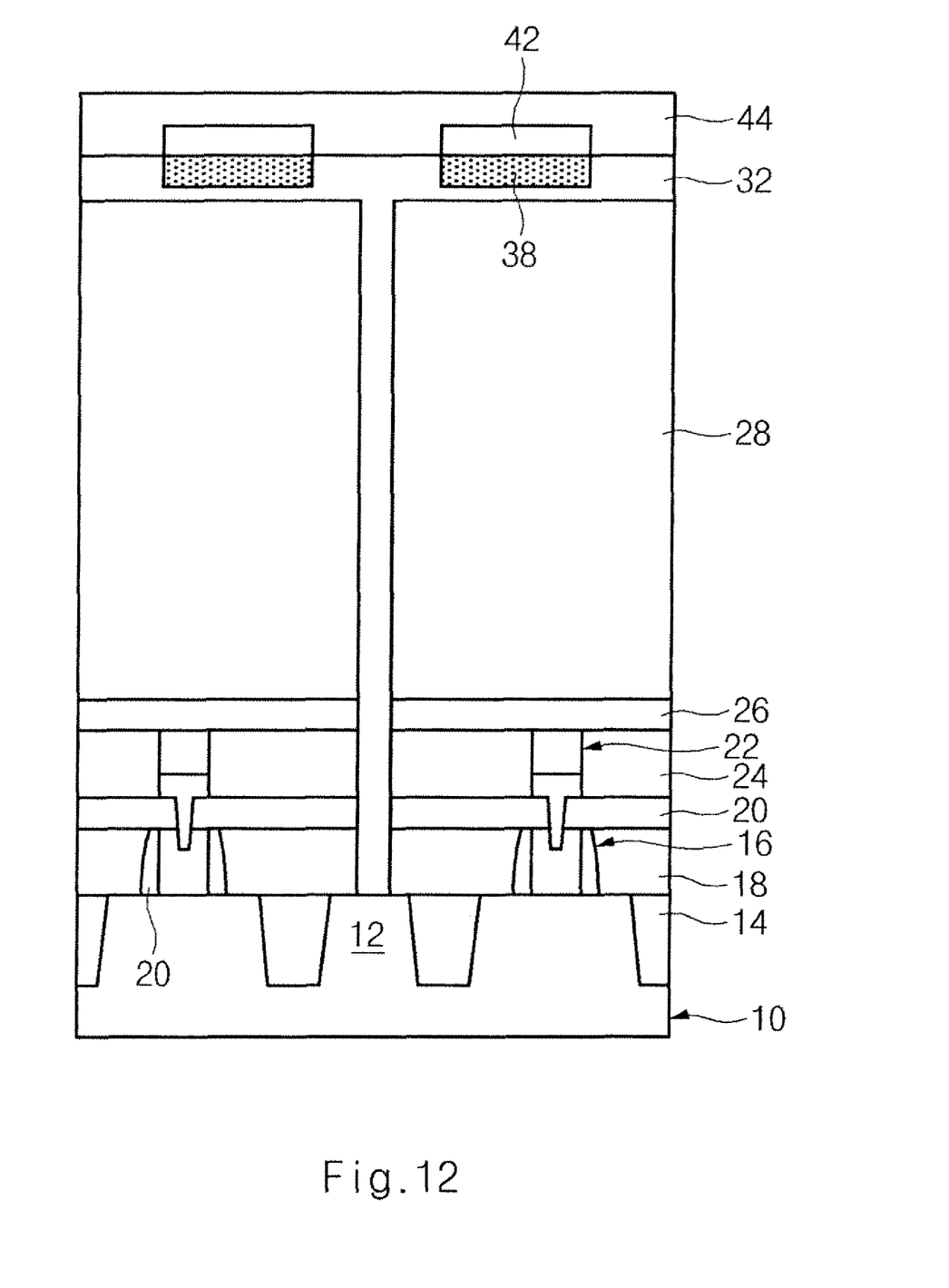

Referring to FIG. 12, a third hard mask layer 44 is formed over the second silicon layer 42 and the first silicon layer 32. The third hard mask layer 44 includes an oxide film to have a thickness ranging from about 100 Å to about 3000 Å.

Figure 13:
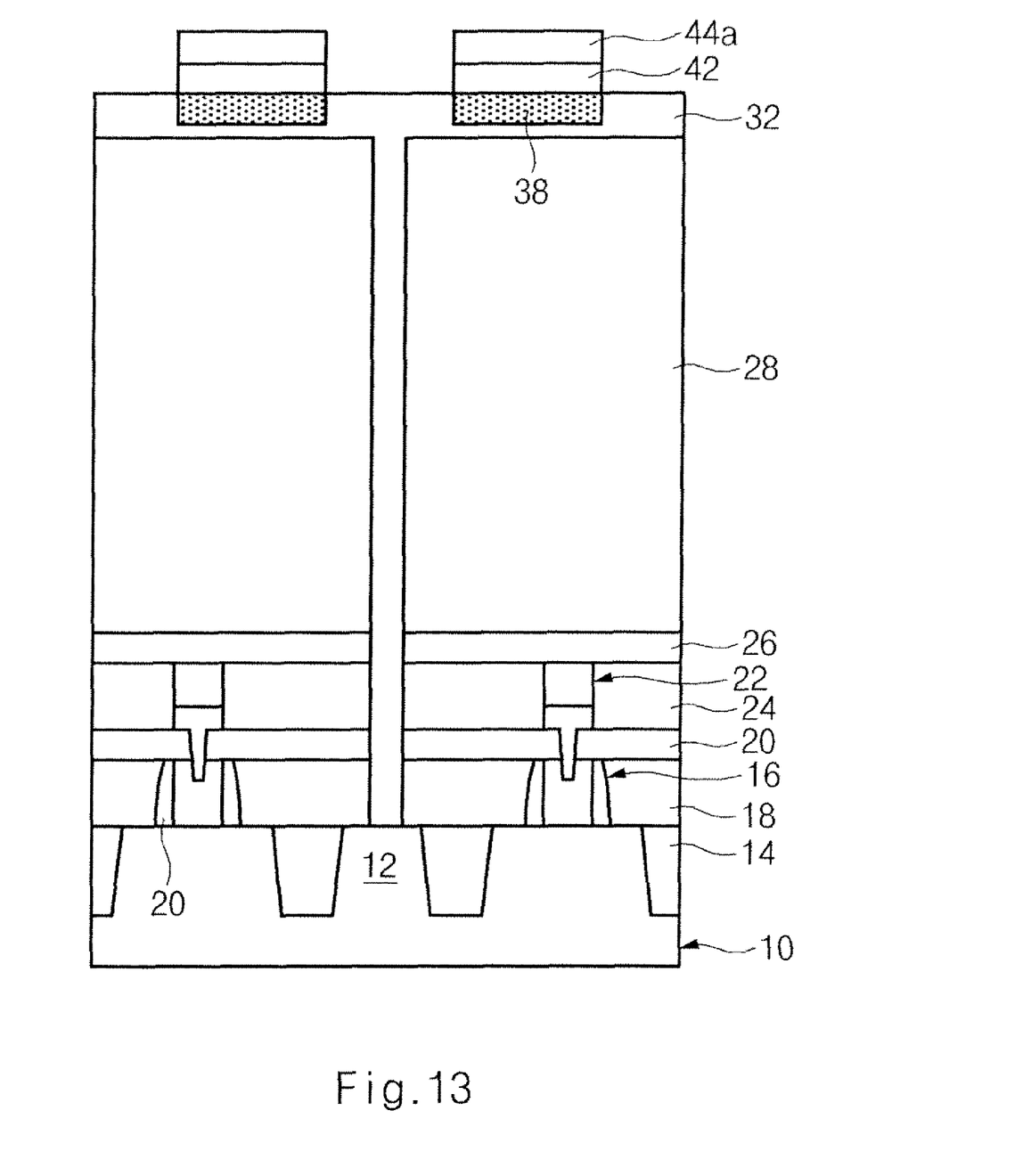

Referring to FIG. 13, the third hard mask layer 44 of the rest region except the NMOS region is removed to form a third hard mask pattern 44a that exposes the first silicon layer 32. The third hard mask layer 44 is removed by a plasma etching process.

Figure 14:
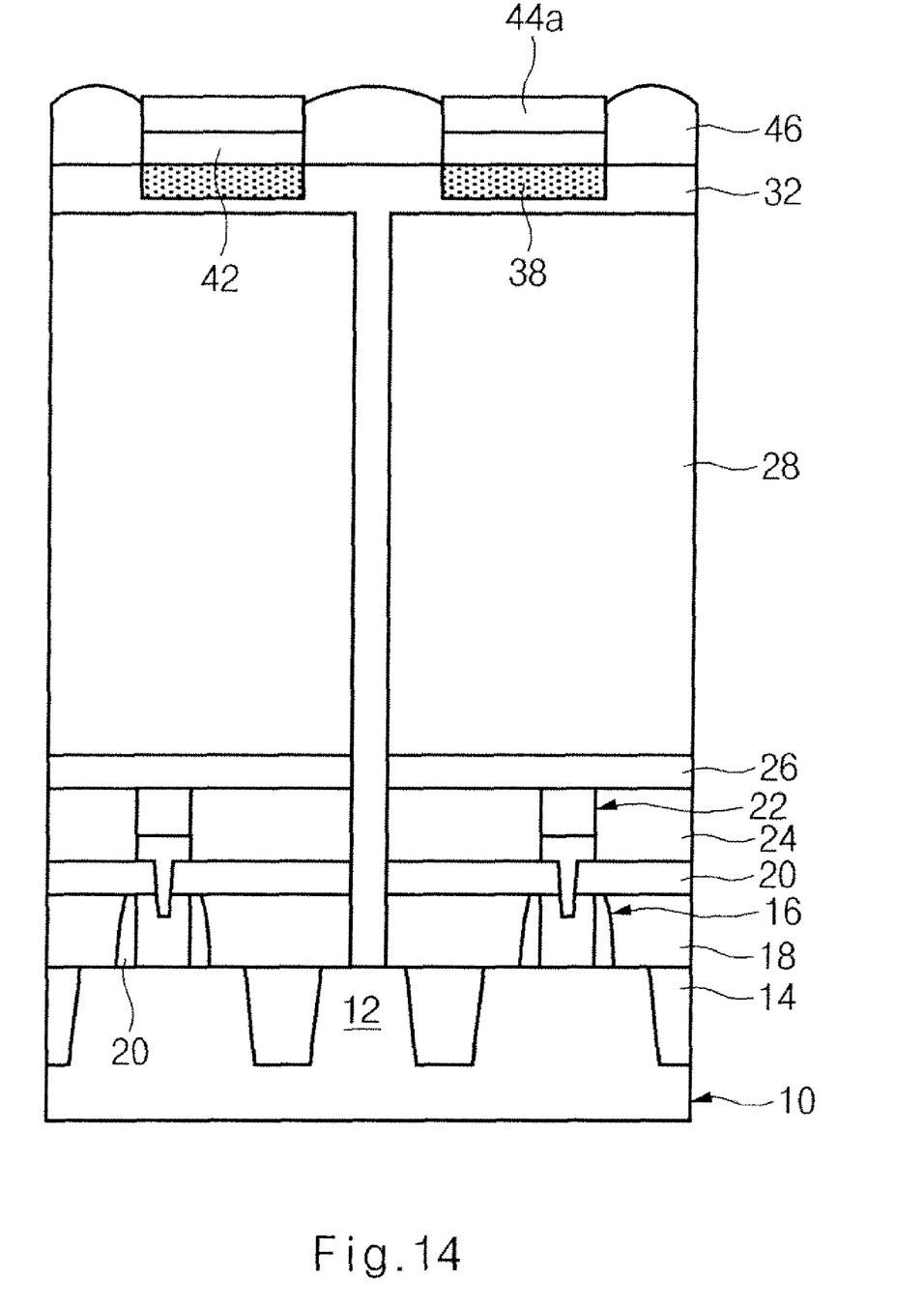

Referring to FIG. 14, a third silicon layer 46 is formed over the first silicon layer 32 with the first silicon layer 32 exposed by the third hard mask pattern 44a as a seed layer. The third silicon layer 46 is formed by a SEG process to have a thickness ranging from about 300 Å to about 2000 Å.

Figure 15:
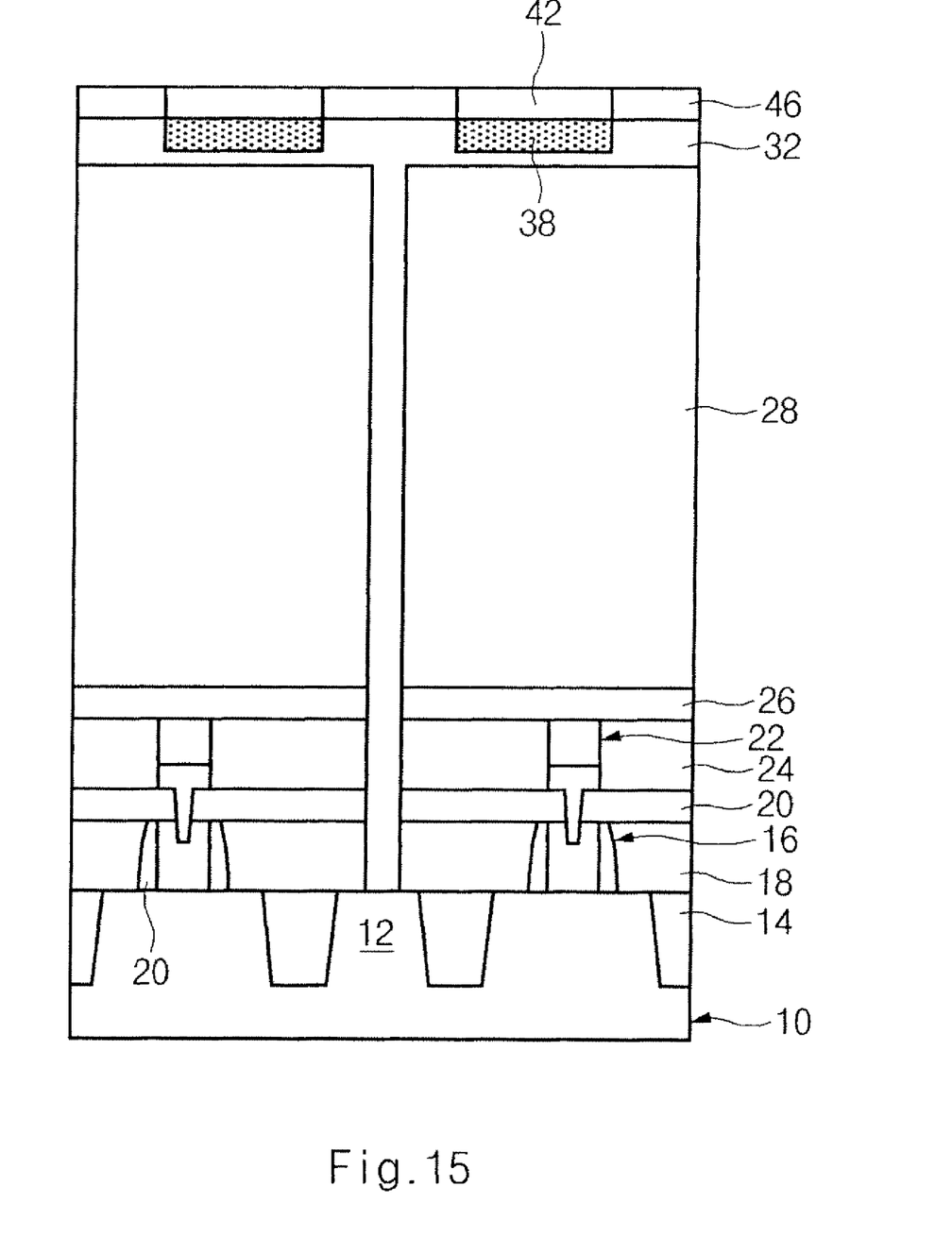

Referring to FIG. 15, the third hard mask pattern 44a and the third silicon layer 46 are planarized to expose the second silicon layer 42. The third hard mask pattern 44a and the third silicon layer 46 are planarized by a process selected from the group consisting of a chemical mechanical polishing (CMP) process, an etch-back process and combinations thereof.

Figure 16:
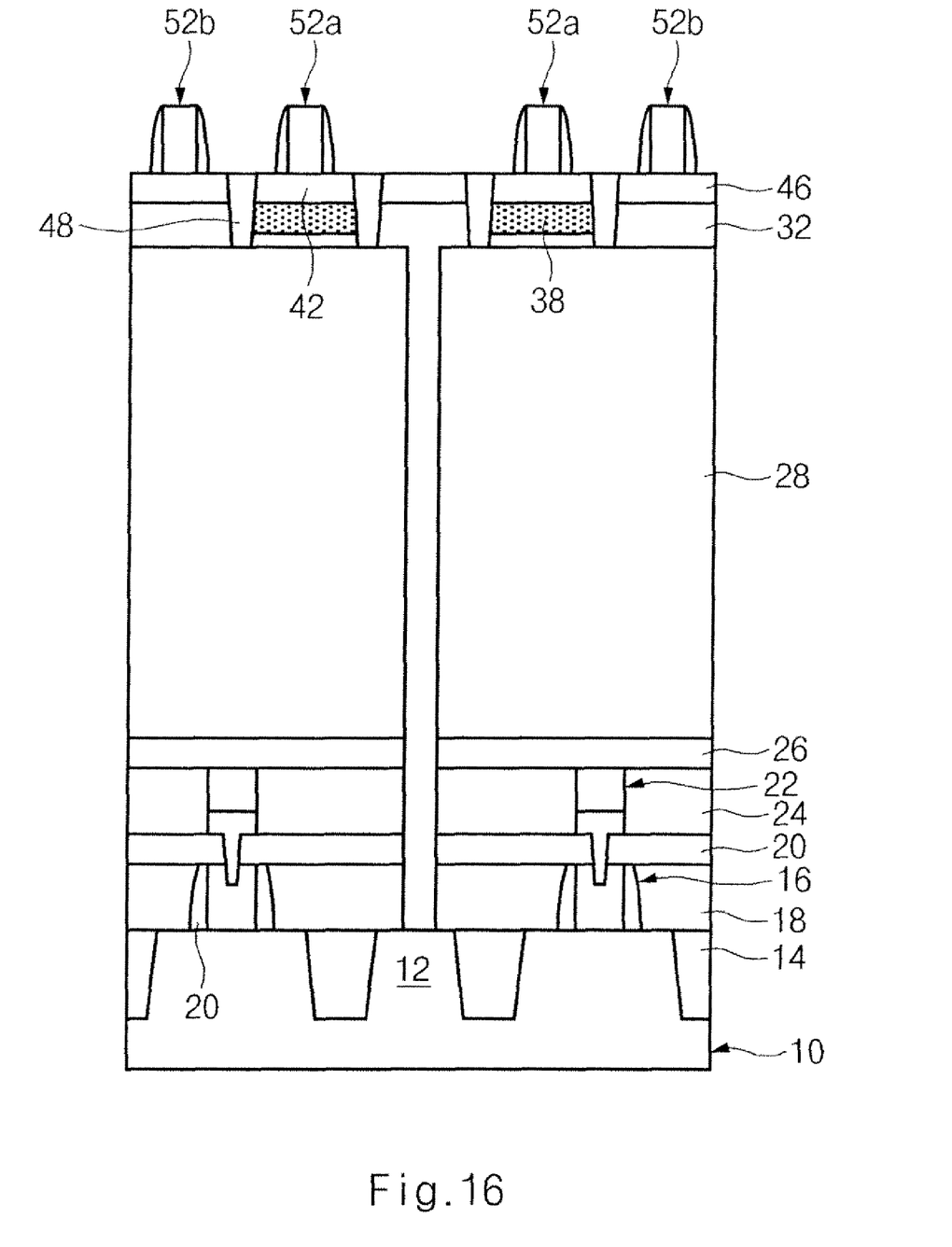

Referring to FIG. 16, a second device isolating film 48 is formed in the first and third silicon layers 32 and 46. The second device isolating film 48 is formed by a STI process. A gate 52a of a NMOS transistor is formed over the second silicon layer 42, and a gate 52b of a PMOS transistor is formed over the third silicon layer 46.

The NMOS transistor is formed over the relaxed Si1-xGex layer 38 and the second silicon layer 42. As a result, a tensile stress is given to the second silicon layer 42 by the relaxed Si1-xGex layer 38 to increase electron mobility.

As described above, according to an embodiment of the present invention, a method for manufacturing a semiconductor device may include forming a NMOS transistor of a peripheral circuit region over a relaxed silicon germanium layer and a silicon layer to have a tensile strain structure, thereby increasing electron mobility of a channel region in operation of the device. The semiconductor device may include a transistor having a stacked structure in a peripheral circuit region to increase net die.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
    forming an active region in a semiconductor substrate;
    forming a first silicon layer over the active region, wherein the first silicon layer is coupled to the active region;
    forming a relaxed silicon germanium layer in a trench formed in an NMOS region of the first silicon layer;
    forming a second silicon layer over the relaxed silicon germanium layer;
    forming a third silicon layer over a PMOS region except the NMOS region of the first silicon layer; and
    forming a gate on the second silicon layer and the third silicon layer;
    wherein forming the third silicon layer includes:
    forming a third hard mask pattern exposing the PMOS region on the second silicon layer;
    growing a silicon layer using by the third hard mask pattern as a growth barrier on the first silicon layer; and
    exposing the second silicon layer by planarizing the third hard mask pattern and the third silicon layer.

2. The method according to claim 1, wherein the forming a first silicon layer includes:
    forming an insulating film on the active region;
    forming a contact hole exposing the active region by penetrating the insulating film; and
    growing a silicon layer in the contact hole and on the insulating film.

3. The method according to claim 2, wherein the first silicon layer is formed with a thickness in a range of 500 Å to 20000 Å from a top surface of the insulating film.

4. The method according to claim 2, wherein the first silicon layer is formed by a selective epitaxtial growth.

5. The method according to claim 1, wherein the forming a relaxed silicon germanium layer includes:
    forming a first hard mask pattern exposing the NMOS region on the first silicon layer;
    forming the trench in the NMOS region by using the first hard mask pattern as an etch mask;
    growing a relaxed silicon germanium layer in the trench; and
    removing the first hard mask pattern and planarizing the relaxed silicon germanium layer.

6. The method according to claim 5, wherein the trench has a depth ranging from 300 Å to 10000 Å.

7. The method according to claim 5, wherein the relaxed silicon germanium layer is formed by selective epitaxtial growth under a condition that a mole ratio of the germanium in the relaxed silicon germanium layer is increased from a bottom to a top of the trench.

8. The method according to claim 7, wherein the mole ratio of the germanium in the relaxed silicon germanium layer is 0.1 to 0.5.

9. The method according to claim 1, wherein the relaxed silicon germanium layer has a thickness ranging from 300 Å to 10000 Å.

10. The method according to claim 1, wherein the forming the second silicon layer includes:
    forming a second hard mask pattern exposing the relaxed silicon germanium layer on the first silicon layer;
    growing a silicon layer using by the second hard mask pattern as a growth barrier; and
    planarizing the second silicon layer and removing the second hard mask pattern.

11. The method according to claim 10, wherein the second silicon layer is formed by a selective epitaxtial growth.

12. The method according to claim 10, wherein the second silicon layer has a thickness ranging from 500 Å to 2000 Å.

13. The method according to claim 1, wherein the third silicon layer is formed by selective epitaxtial growth.

14. The method according to claim 1, wherein the third silicon layer has a thickness ranging from 300 Å to 2000 Å.

* * * * *